United States Patent
Li et al.

(10) Patent No.: US 9,263,186 B2
(45) Date of Patent: Feb. 16, 2016

(54) DC/AC DUAL FUNCTION POWER DELIVERY NETWORK (PDN) DECOUPLING CAPACITOR

(71) Applicant: QUALCOMM Incorporated, San Diego, CA (US)

(72) Inventors: Yue Li, San Diegoc, CA (US); Xiaoming Chen, San Diego, CA (US); Zhongping Bao, San Diego, CA (US); Charles D. Paynter, San Diego, CA (US); Xiaonan Zhang, San Diego, CA (US); Ryan D. Lane, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 13/785,502

(22) Filed: Mar. 5, 2013

(65) Prior Publication Data

US 2014/0252544 A1   Sep. 11, 2014

(51) Int. Cl.

| | |
|---|---|
| *H01L 49/02* | (2006.01) |
| *H01G 2/06* | (2006.01) |
| *H01L 23/50* | (2006.01) |
| *H01L 23/64* | (2006.01) |
| *H01L 23/00* | (2006.01) |
| *H01G 4/38* | (2006.01) |
| *H01G 4/40* | (2006.01) |
| *H01L 23/498* | (2006.01) |

(52) U.S. Cl.
CPC . *H01G 2/06* (2013.01); *H01G 4/38* (2013.01); *H01G 4/40* (2013.01); *H01L 23/50* (2013.01); *H01L 23/642* (2013.01); *H01L 24/17* (2013.01); *H01L 23/49822* (2013.01); *H01L 23/49827* (2013.01); *H01L 2224/16225* (2013.01); *H01L 2924/19104* (2013.01); *H01L 2924/19105* (2013.01)

(58) Field of Classification Search
CPC ........... H01L 2224/16225; H01L 2924/15311; H01L 23/642; H05K 1/0231; H05K 2201/10515; H05K 2201/10734; H01G 4/228; H01G 4/30
USPC ......... 361/306.2, 321.2, 306.3; 257/532, 678, 257/686, 723, 777
See application file for complete search history.

(56) References Cited

U.S. PATENT DOCUMENTS 6,703,697 B2    3/2004  Leahy et al.
6,884,939 B2 *  4/2005  Dishongh et al. ............. 174/534

(Continued)

*Primary Examiner* — David Vu
*Assistant Examiner* — Jonathan Han
(74) *Attorney, Agent, or Firm* — Loza & Loza, LLP

(57) ABSTRACT

Some implementations provide a semiconductor device that includes a first substrate, a die coupled to the first substrate, and a set of solder balls coupled to the first substrate. The set of solder balls is configured to provide an electrical connection between the die and a second substrate. The semiconductor device also includes at least one decoupling capacitor coupled to the die through the first substrate. The at least one decoupling capacitor is configured to provide an electrical connection between the die and the second substrate. The at least one decoupling capacitor is coupled to the first substrate such that the at least one decoupling capacitor is positioned between the first substrate and the second substrate. In some implementations, the second substrate is a printed circuit board (PCB). In some implementations, the first substrate is a first package substrate, and the second substrate is a second package substrate.

34 Claims, 13 Drawing Sheets

(56) References Cited

U.S. PATENT DOCUMENTS

| | | |
|---|---|---|
| 6,900,991 B2 | 5/2005 | Patel et al. |
| 7,123,465 B2 | 10/2006 | Crane, Jr. et al. |
| 7,378,733 B1 | 5/2008 | Hoang et al. |
| 7,567,425 B1 * | 7/2009 | Lee et al. .................... 361/306.3 |
| 2002/0135053 A1 * | 9/2002 | Figueroa et al. .............. 257/678 |
| 2007/0194876 A1 * | 8/2007 | Lim et al. ....................... 336/223 |
| 2011/0316119 A1 * | 12/2011 | Kim et al. ..................... 257/532 |
| 2012/0080222 A1 * | 4/2012 | Kim et al. .................... 174/260 |

\* cited by examiner

DC/AC DUAL FUNCTION POWER DELIVERY NETWORK (PDN) DECOUPLING CAPACITOR

BACKGROUND

1. Field

Various features relate to a DC/AC dual function PDN decoupling capacitor.

2. Background

In modern electronics, Power Delivery Networks (PDNs) are used to deliver power from a power supply/source to integrated circuits (ICs)/dies. However, PDNs inherently suffer from noise and/or resonance, which interfere with the ICs the PDNs are meant to power. One solution to avoid or minimize this interference is to use a circuit to decouple power supplies from PDNs. Existing decoupling solutions for PDNs are based on multi-layer ceramic capacitors (MLCCs), which are an example of a decoupling capacitor for a PDN. However, MLCCs have limited noise reduction/resonance suppression capabilities. As such, the MLCC approach cannot provide adequate noise reduction/resonance suppression in a PDN unless multiple capacitors are used. To overcome this deficiency, multiple MLCCs must be used in a PDN to provide adequate noise reduction/resonance suppression in a PDN. However, MLCCs are relatively large and take up a lot of space/real estate in a die, die package and/or printed circuit board (PCB) designs, which is not desirable when designing dies, die packages and/or PCBs with limited and/or small real estate.

FIG. 1 illustrates a configuration of several decoupling capacitors on a printed circuit board (PCB). Specifically, FIG. 1 illustrates a printed circuit board (PCB) 100 that includes a package 102. The PCB 100 and the package 102 is part of a power delivery network (PDN). The package 102 is an integrated circuit package. The package 102 is coupled to the PCB 100 through a set of solder balls 104, which are located between the PCB 100 and the package 102. FIG. 1 also illustrates a first decoupling capacitor 106 and a second decoupling capacitor 108. The first and second decoupling capacitors 106-108 are also part of the PDN and are coupled to a power source (not shown) of the PDN through a route 110.

Given the ever limited space in electronic device packaging, there may not be space for the multiple MLCCs needed to provide enough resonance suppression in a PDN. Therefore, there is a need for providing a decoupling solution in PDNs that perform better than current solutions. Ideally, such a decoupling solution will utilize less space and/or real estate in a chip design.

SUMMARY

Various features, apparatus and methods described herein provide a DC/AC dual function PDN decoupling capacitor.

A first example provides a semiconductor device that includes a first substrate, a die coupled to the first substrate, and a set of solder balls coupled to the first substrate. The set of solder balls is configured to provide an electrical connection between the die and a second substrate. The semiconductor device also includes at least one decoupling capacitor coupled to the die through the first substrate. The at least one decoupling capacitor is configured to provide an electrical connection between the die and the second substrate. The at least one decoupling capacitor is coupled to the first substrate such that the at least one decoupling capacitor is positioned between the first substrate and the second substrate.

According to an aspect, the first substrate includes a set of vias that are configured to provide an electrical connection between the die and the at least one decoupling capacitor. In some implementations, the set of vias and the at least one decoupling capacitor is part of a power delivery network for the die.

According to one aspect, the decoupling capacitor is a multi-layer ceramic capacitor (MLCC).

According to an aspect, the second substrate is a printed circuit board (PCB).

According to one aspect, the first substrate is a first package substrate, the second substrate is a second package substrate, and the die is a first die. In some implementations, the semiconductor device further includes a second die positioned between the first package substrate and the second package substrate. The semiconductor device is integrated in a package on package (PoP) configuration.

According to an aspect, the at least one decoupling capacitor is configured to provide noise reduction in a power delivery network (PDN) for the die.

According to one aspect, the at least one decoupling capacitor is aligned along one of a row of solder balls and/or a column of solder balls.

According to an aspect, the at least one decoupling capacitor is aligned diagonally with respect to a row of solder balls and/or a column of solder balls.

According to one aspect, the semiconductor device is incorporated into at least one of a music player, a video player, an entertainment unit, a navigation device, a communications device, a mobile phone, a smartphone, a personal digital assistant, a fixed location terminal, a tablet computer, and/or a laptop computer.

A second example provides an apparatus that includes a first substrate, a die coupled to the first substrate, and a set of solder balls coupled to the first substrate. The set of solder balls configured to provide an electrical connection between the die and a second substrate. The apparatus also includes a decoupling means coupled to the die through the first substrate. The decoupling means configured to provide an electrical connection between the die and the second substrate, the decoupling means coupled to the first substrate such that the decoupling means is positioned between the first substrate and the second substrate.

According to an aspect, the first substrate includes a set of vias that are configured to provide an electrical connection between the die and the decoupling means. In some implementations, the set of vias and the decoupling means is part of a power delivery network for the die.

According to one aspect, the decoupling means is a multi-layer ceramic capacitor (MLCC).

According to an aspect, the second substrate is a printed circuit board (PCB).

According to one aspect, the first substrate is a first package substrate, the second substrate is a second package substrate, and the die is a first die. In some implementations, the apparatus further includes a second die positioned between the first package substrate and the second package substrate. The semiconductor device is integrated in a package on package (PoP) configuration.

According to an aspect, the decoupling means is configured to provide noise reduction in a power delivery network (PDN) for the die.

According to one aspect, the decoupling means is aligned along one of a row of solder balls and/or a column of solder balls.

According to an aspect, the decoupling means is aligned diagonally with respect to a row of solder balls and/or a column of solder balls.

According to one aspect, the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

A third example provides a method for providing a semiconductor device. The method provides a first substrate. The method also provides a die coupled to the first substrate. The method further provides a set of solder balls coupled to the first substrate. The set of solder balls is configured to provide an electrical connection between the die and a second substrate. The method provides at least one decoupling capacitor coupled to the die through the first substrate. The at least one decoupling capacitor is configured to provide an electrical connection between the die and the second substrate. The at least one decoupling capacitor is coupled to the first substrate such that the at least one decoupling capacitor is positioned between the first substrate and the second substrate.

According to an aspect, the first substrate includes a set of vias that are configured to provide an electrical connection between the die and the at least one decoupling capacitor. In some implementations, the set of vias and the at least one decoupling capacitor is part of a power delivery network for the die.

According to one aspect, the decoupling capacitor is a multi-layer ceramic capacitor (MLCC).

According to an aspect, the second substrate is a printed circuit board (PCB).

According to one aspect, the first substrate is a first package substrate, the second substrate is a second package substrate, and the die is a first die. In some implementations, the method further provides a second die positioned between the first package substrate and the second package substrate. The semiconductor device is integrated in a package on package (PoP) configuration.

According to an aspect, the at least one decoupling capacitor is configured to provide noise reduction in a power delivery network (PDN) for the die.

According to one aspect, the at least one decoupling capacitor is aligned along one of a row of solder balls and/or a column of solder balls.

According to an aspect, the at least one decoupling capacitor is aligned diagonally with respect to a row of solder balls and/or a column of solder balls.

According to one aspect, the method further comprises incorporating the semiconductor device into at least one of a music player, a video player, an entertainment unit, a navigation device, a communications device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Several novel features pertain to a semiconductor device (e.g., die package) that includes a first substrate, a die coupled to the first substrate, and a set of solder balls coupled to the first substrate. The set of solder balls is configured to provide an electrical connection between the die and a second substrate. The semiconductor device also includes at least one decoupling capacitor coupled to the die through the first substrate. The at least one decoupling capacitor is configured to provide an electrical connection between the die and the second substrate. The at least one decoupling capacitor is coupled to the substrate such that the at least one decoupling capacitor is positioned between the first substrate and the second substrate. In some implementations, the second substrate is a printed circuit board (PCB). In some implementations, the first substrate is a first package substrate, and the second substrate is a second package substrate.

Exemplary Decoupling Capacitor Between Die Package and Printed Circuit Board

Figure 1:
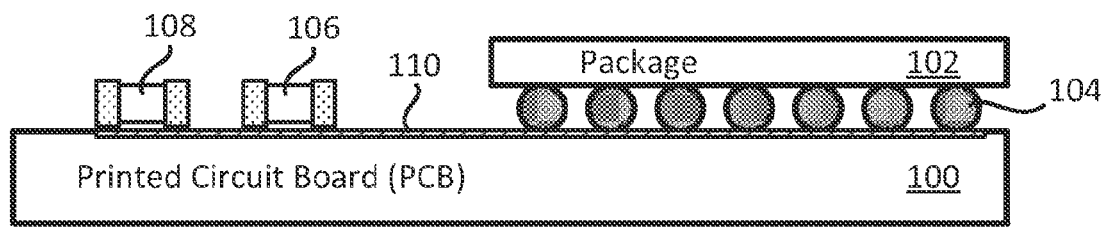
FIG. 1 illustrates a conventional configuration of several decoupling capacitors on a printed circuit board (PCB).
Figure 2:
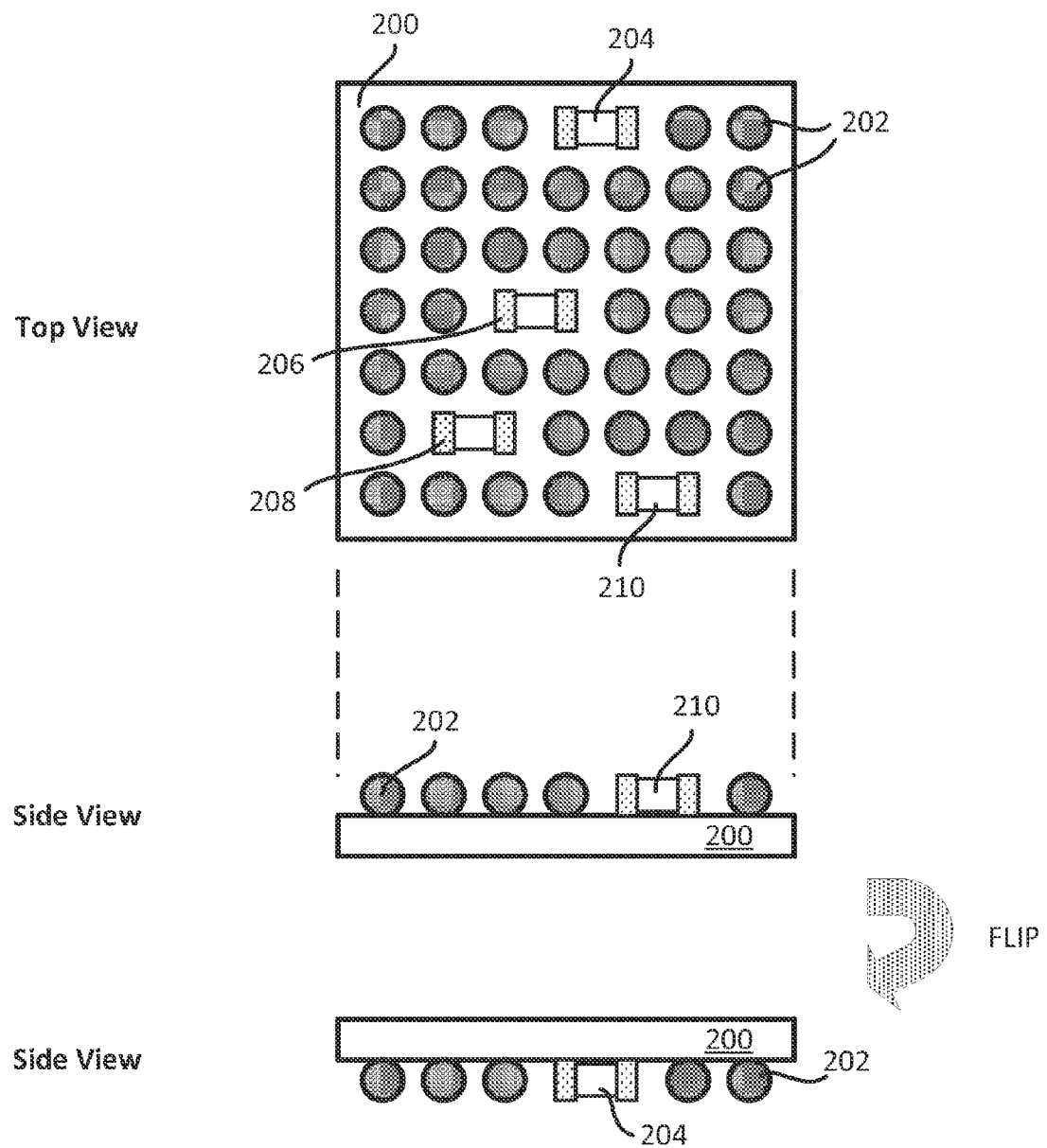
FIG. 2 illustrates a configuration of several decoupling capacitors on a die package.

FIG. 2 conceptually illustrates an integrated circuit (IC)/die package that includes novel placement of decoupling capacitors. Specifically, FIG. 2 illustrates a die package 200 coupled to a set of solder balls 202 and capacitors 204-210. The die package 200 includes a back side or an active side. The set of solder balls 202 and the capacitors 204-210 are coupled to the back side or active side of the die package 200 in some implementations. The die package 200 may include at least one die/wafer and a packaging substrate (both not shown). In some implementations, the die package 200 is a system-in-package (SiP). The set of solder balls 202 is coupled to the die package 200 and is configured to provide an electrical connection between the die package 200 and a printed circuit board (PCB) (e.g., substrate) when the die package 200 is coupled (e.g., mounted) to a PCB. More specifically, in some implementations, the set of solder balls 202 is coupled to the die package 200 and is configured to provide an electrical connection between the die and a printed circuit board (PCB) when the die package 200 is coupled to a PCB.

In some implementations, at least one of the capacitors 204-210 is a decoupling capacitor. As such, at least one of the capacitors 204-210 is configured to provide noise reduction in a power delivery network (PDN) that includes the die package 200. In some implementations, at least one capacitor is configured to decouple one part of an electrical network from another. In some implementations, the capacitor 204 allows some or all of the power signals to and from the die package 200 (e.g., die inside the die package) to bypass some or all of the solder balls 202 in a power delivery network. It should be noted that in some implementations, solder may be used to couple the capacitor to the substrate (e.g., package substrate, PCB). Such solder is small relative to the solder balls, and shall not be considered part of the solder balls.

In some implementations, one or more of the capacitors 204-210 may be a multi-layer ceramic capacitor (MLCC). In some implementations, one or more of the capacitors 204-210 is configured to provide an electrical connection between the die package (e.g., die) and a PCB when the die package 200 is coupled to a PCB. In some implementations, at least one of the capacitors 204-210 is coupled to the die package 200 such that at least one of the capacitors 204-210 is positioned between the die package 200 and a PCB when the die package is coupled to a PCB. Once the solder balls (e.g., solder balls 202) and the capacitors (e.g., capacitors 204-210) are coupled to the die package (e.g., die package 200), the die package may be flipped so that the die package can be coupled (e.g., mounted) to a PCB.

As shown in the top view of FIG. 2, there are four capacitors 204-210 positioned in different locations on the die package 200. Different implementations may position the four capacitors differently. As such, in some implementations, the position of the four capacitors 204-210 may be different. In addition, the alignment of the four capacitors 204-210 may be different. For examples, some capacitors may be aligned along a column of solder balls, while other capacitors may be aligned along a row of solder balls (as shown in FIG. 2). Some capacitors may also be aligned diagonally with respect to a row and/or column of solder balls. Moreover, some implementations may use more or less capacitors (e.g., more or less than 4 capacitors). In some implementations, different types, sizes, and/or combinations of capacitors may be used.

Figure 3:
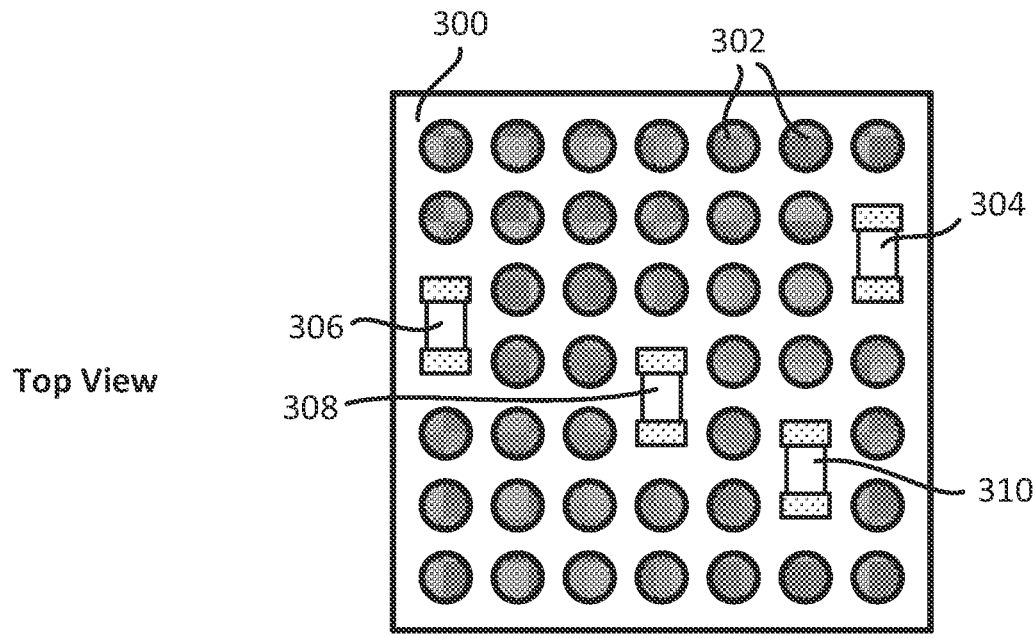
FIG. 3 illustrates another configuration of several decoupling capacitors on a die package.
Figure 4:
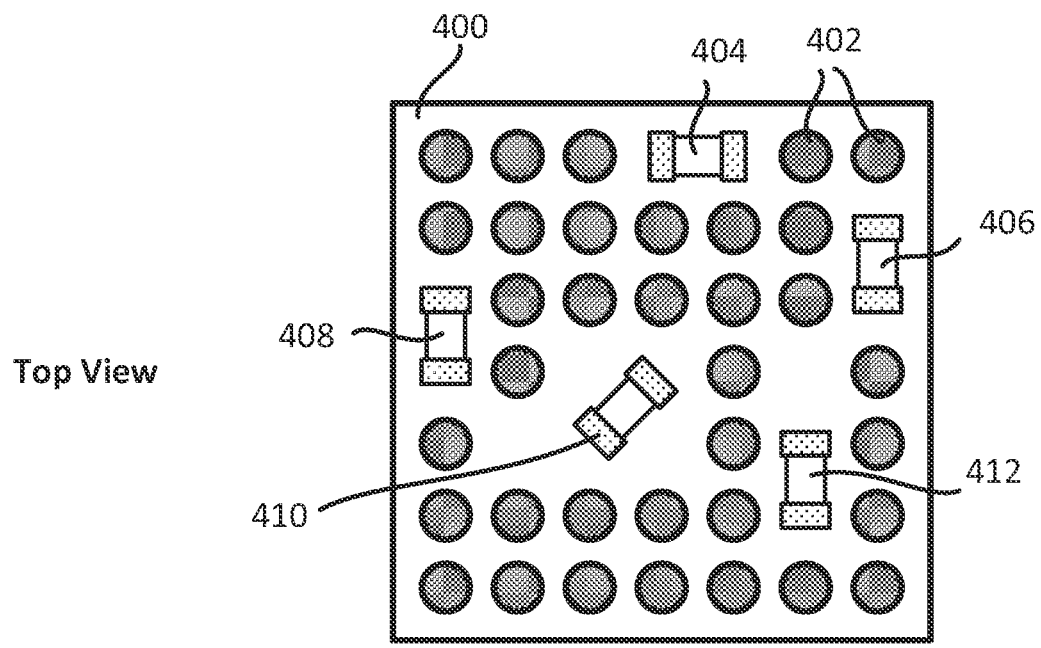
FIG. 4 illustrates another configuration of several decoupling capacitors on a die package.
Figure 5:
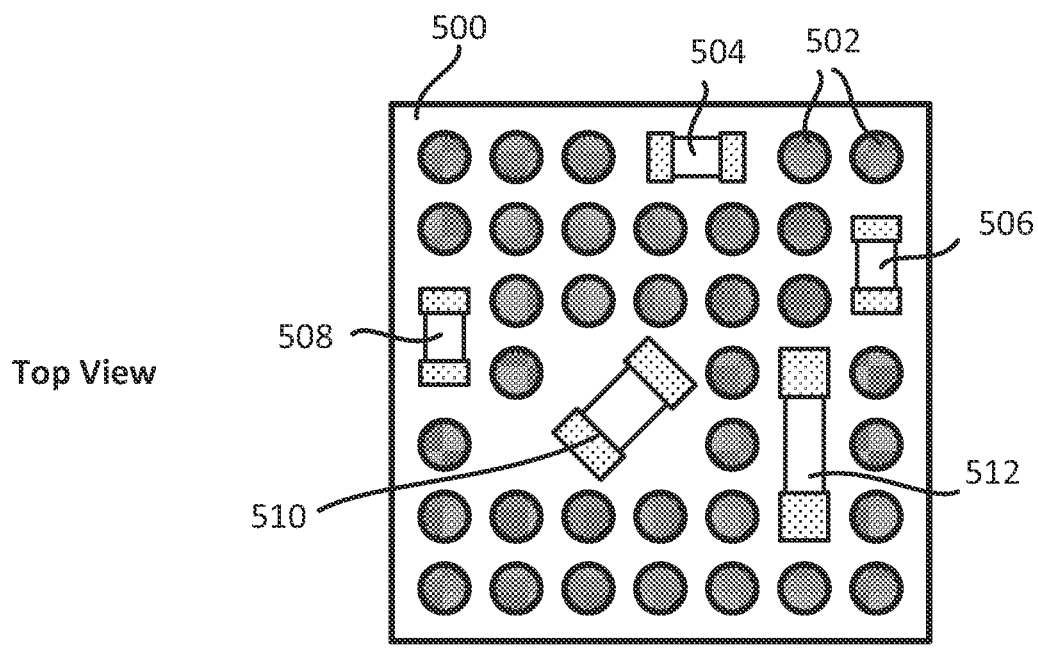
FIG. 5 illustrates another configuration of several decoupling capacitors on a die package.

FIGS. 3-5 illustrate several different configurations of capacitors coupled to a die package in some implementations. Some or all of the capacitors shown in FIGS. 3-5 are decoupling capacitors used in a power delivery network (PDN) in some implementations. FIG. 3 illustrates an integrated circuit (IC)/die package 300 that includes a set of solder balls 302 and several capacitors 304-310. As shown in FIG. 3, the capacitors 304-310 is coupled to the die package 300 and are aligned along a column of solder balls. FIG. 4 illustrates another die package 400 that includes a set of solder balls 402 and several capacitors 402-412. As shown in FIG. 4, one of the capacitors (e.g., capacitor 404) is aligned along a row of solder balls, while some of the capacitors (e.g., capacitor 408) are aligned along a column of solder balls. In addition, one capacitor (e.g., capacitor 410) is diagonally aligned with respect to the row and/or column of solder balls.

As mentioned above, some implementations may use different types and sizes of capacitors. FIG. 5 illustrates an example of such a configuration of capacitors coupling (e.g., placement) on a die package in some implementations. As shown in FIG. 5, the die package 500 includes a set of solder balls 502 and several capacitors 504-512. The capacitor 504 is aligned along a row of solder balls, the capacitors 506-508 are both aligned along their own respective column of solder balls. The capacitor 510 is aligned in a diagonal direction with respect to a row and/or column of solder balls. FIG. 5 also shows that the capacitor 510 is larger/bigger than some of the other capacitors (e.g., capacitor 506). In some implementations, the bigger/larger capacitor 510 may have better decoupling performance/capabilities than some of the other capacitors (e.g., capacitor 506). The capacitor 512 is aligned along a column of solder balls and traverses three rows of solder balls. As such, the capacitor 512 is longer than some of the other capacitors (e.g., capacitor 508), which traverses two rows or columns of solder balls. In some implementations, the longer capacitor 512 may have better decoupling performance/capabilities than some of the other capacitors (e.g., capacitor 508).

Figure 6:
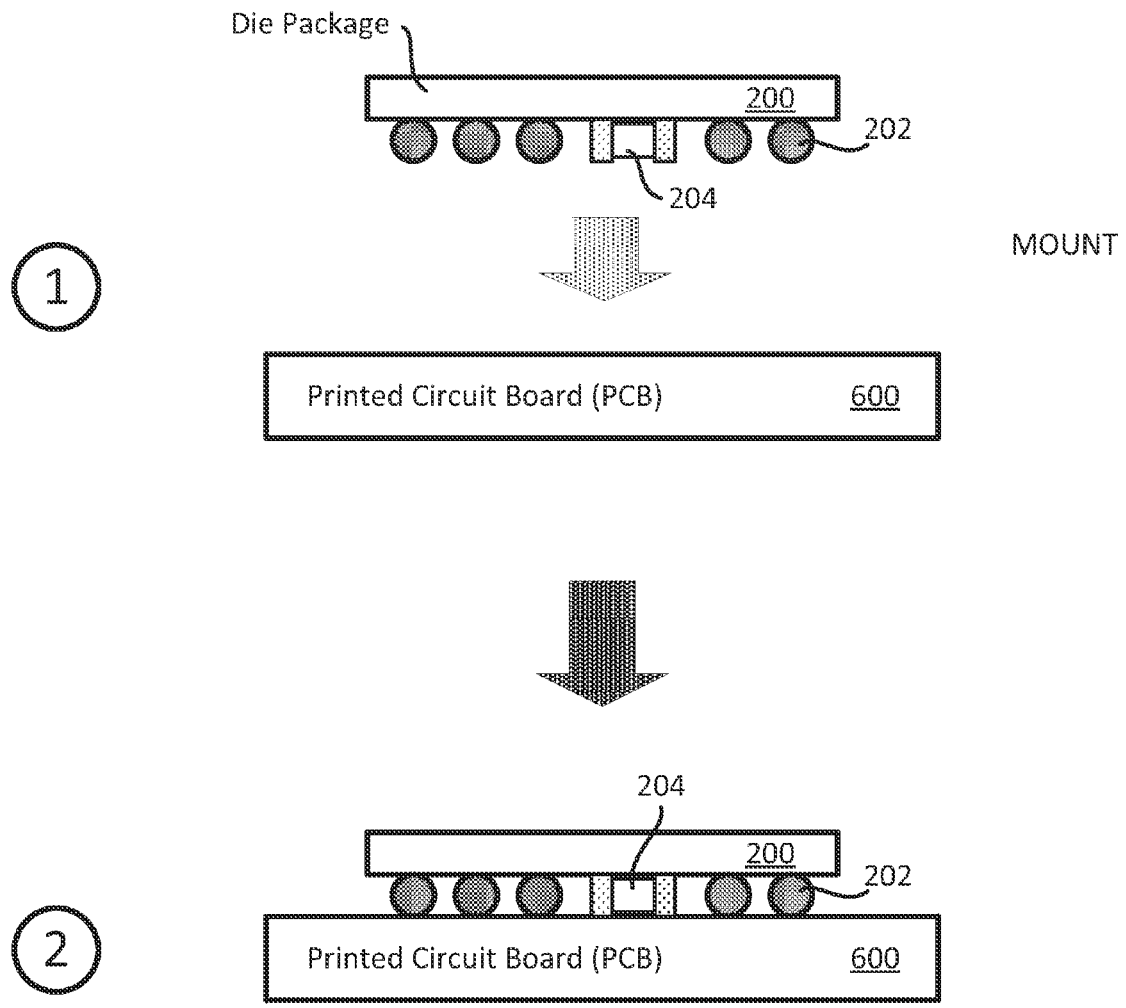
FIG. 6 illustrates a sequence of a die package with a decoupling capacitor being couple to a printed circuit board.

FIG. 6 illustrates the coupling (e.g., mounting) of a die package having at least one capacitor to a printed circuit board. Specifically, FIG. 6 illustrates the die package 200 (which includes the set of solder balls 202 and the capacitor 204) being coupled (e.g., mounted) to a printed circuit board (PCB) 600. Once the die package 200 has been coupled to the PCB 600, the capacitor 204 is positioned between the die package 200 and the PCB 600. More specifically, the capacitor 204 is positioned underneath the die package 200. In this position and configuration, the capacitor 204 is configured to provide an electrical connection/path between the die package 200 and the PCB 600. In particular, in some implementations, the capacitor 204 is configured to provide an electrical connection/path between a die (not shown) in the die package 200 and the PCB 600. More specifically, in some implementations, the capacitor 204 (e.g., decoupling capacitor) is configured to provide an electrical connection/path between a die and the PCB 600 when the die package 200 is coupled (e.g., mounted) to the PCB 600. The capacitor 204 (e.g., decoupling capacitor) is coupled to the die package 200 such that the capacitor 204 is positioned between the die package 200 and the PCB 600 when the die package 200 is coupled on the PCB 600. In some implementations, the capacitor 204 allows some or all of the power signals to and from the die package 200 (e.g., die inside the die package) to bypass some or all of the solder balls 202 in a power delivery network. It should be noted that in some implementations, solder may be used to couple the capacitor to the substrate (e.g., package substrate, PCB). Such solder is small relative to the solder balls (e.g., solder balls 202), and shall not be considered part of the solder balls.

Figure 7:
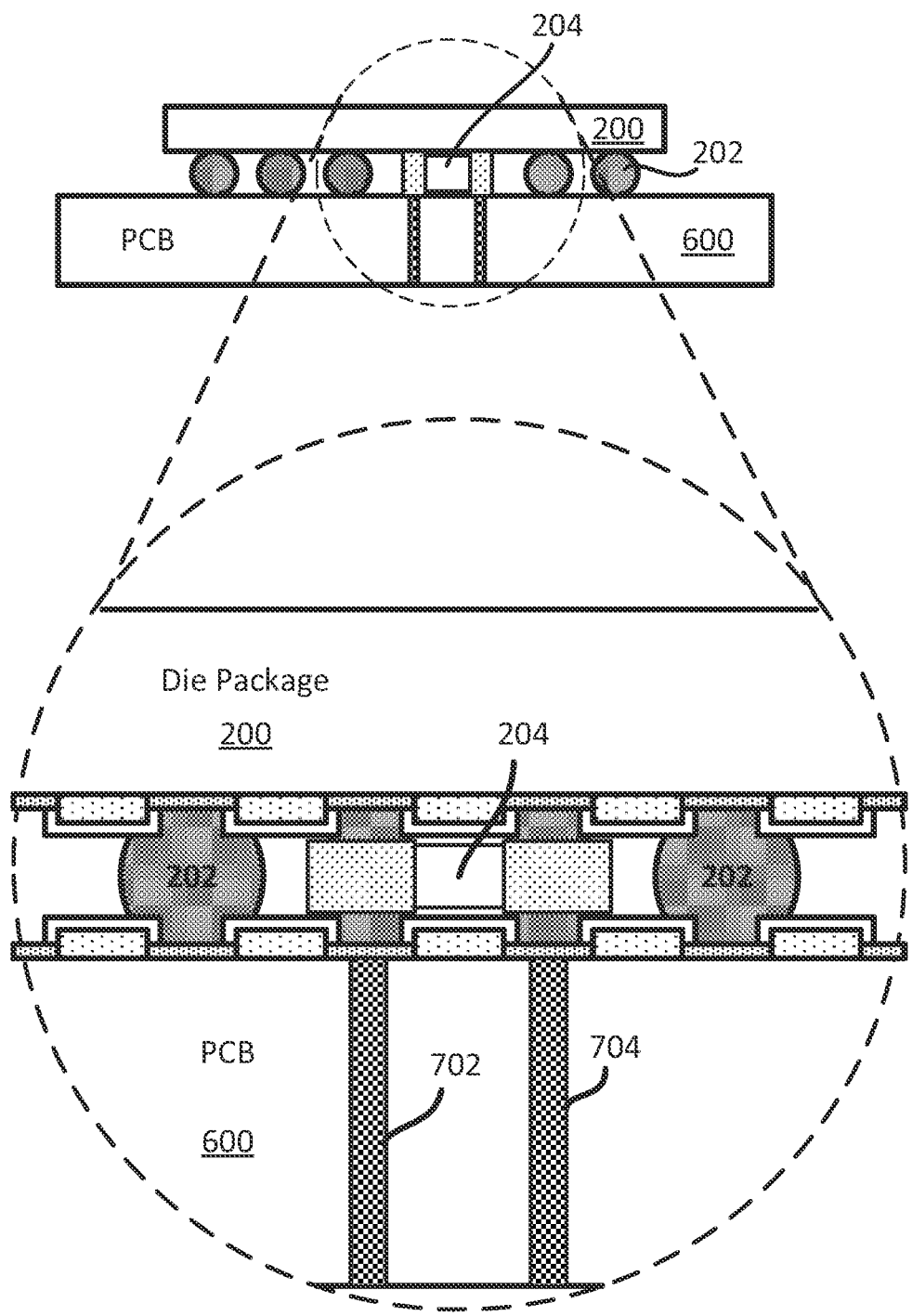
FIG. 7 illustrates a close up view of a die package with a decoupling capacitor coupled to a printed circuit board.

FIG. 7 illustrates a close up view of the capacitor 204 when the package 200 is coupled (e.g., mounted) to the PCB 600. As shown in FIG. 7, the capacitor 204 has a thickness that is less than the thickness of the solder balls 202. As mentioned above, in some implementations, the capacitor 204 provides dual purpose functionalities, namely (1) to provide an electrical connection/path between the die package 200 and the PCB 600, and (2) to provide a noise reduction in a power delivery network (PDN) for the die package 200 and the PCB 600. More specifically, in some implementations, the capacitor 204 (e.g., decoupling capacitor) is configured to provide an electrical connection/path between a die (in the die package 200) and/or the PCB 600 when the die package 200 is coupled (e.g., mounted) to the PCB 600. The capacitor 204

(e.g., decoupling capacitor) is coupled to the die package 200 such that the capacitor 204 is positioned between the die package 200 and the PCB 600 when the die package 200 is coupled on the PCB 600. FIG. 7 also illustrates that the PCB 600 includes a first via 702 and a second via 704. The first and second vias 702-704 may be coupled to the capacitor 204. The vias 702-704 provide a path for a power signal to traverse the PCB 600 to the capacitor 204 from a power source (not shown). In some implementations, the capacitor 204 allows some or all of the power signals to and from the die package 200 (e.g., die inside the die package) to bypass some or all of the solder balls 202 in a power delivery network. It should be noted that in some implementations, solder may be used to couple the capacitor to the substrate (e.g., package substrate, PCB). Such solder is small relative to the solder balls, and shall not be considered part of the solder balls.

Figure 8:
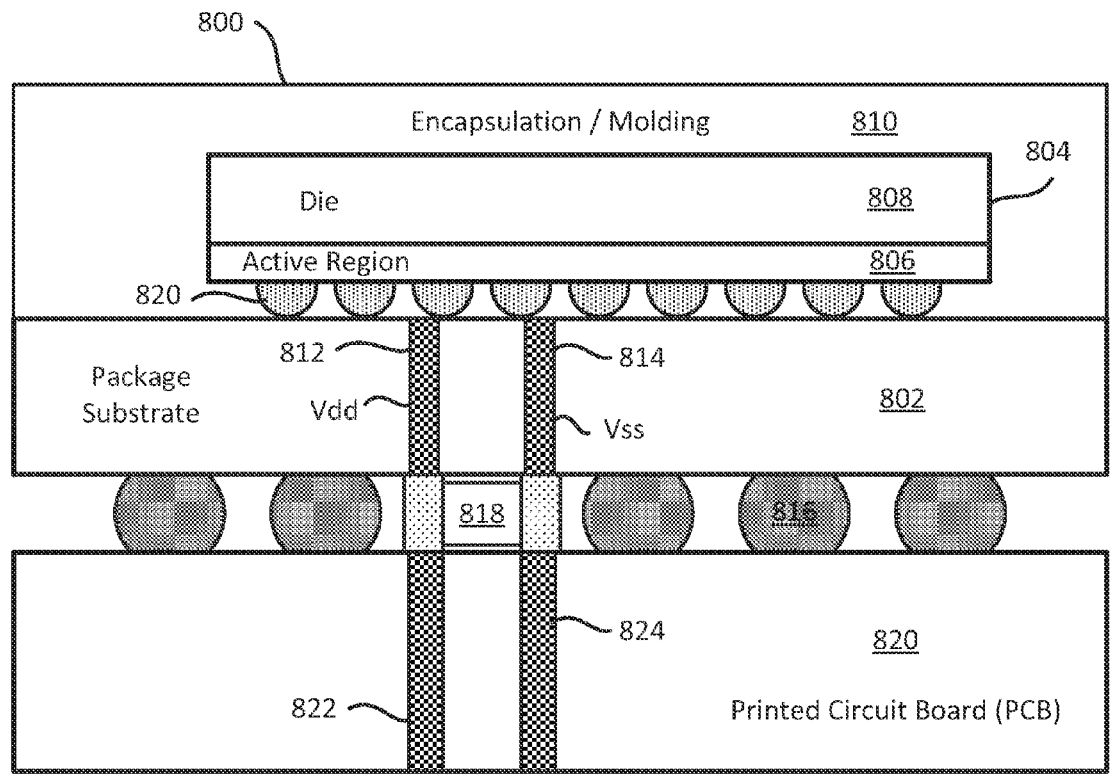
FIG. 8 illustrates a more detailed view of a die package with a decoupling capacitor coupled to a printed circuit board.

FIG. 8 illustrates a more detailed example of a die package coupled (e.g., mounted) to a printed circuit board. Specifically, FIG. 8 illustrates a die package 800 coupled to (e.g., mounted) a printed circuit board (PCB) 820. As shown in FIG. 8, the die package 800 includes a package substrate 802 and a die 804. The die 804 includes an active region 806 and a back side region 808 (e.g., die substrate). The back side region 808 includes metal layers and dielectric layers. The die 804 is surrounded by a molding 810. In some implementations, the molding 810 encapsulates the die 804 and provides a protective layer for the die 804. The package substrate 802 includes a first set of vias 812-814. The first set of vias 812-814 are power signal/ground vias 812-814 for the die package 800. In some implementations, the first set of vias 812-814 are configured to provide an electrical connection/path to and from the die (e.g., die 804) in the die package 800. In some implementations, the first set of vias 812-814 are part of a power delivery network for a die package (e.g., die package 800) and/or die (e.g., die 804) in the die package.

The die package 800 also includes a set of solder balls 816 and a decoupling capacitor 818, which are coupled to the PCB 820. The set of solder balls 816 and the decoupling capacitor 818 allow the die package 800 and the die 804 to be electrically coupled to the PCB 820. In some implementations, signals (e.g., data, power) may traverse from the PCB 820 to the die package 800 through the solder balls 816 and/or capacitor 818. Although only one capacitor is shown between the die package 800 and the PCB 820, in some implementations, multiple capacitors may be located between the die package 800 and the PCB 820. One or more of these capacitors may be configured to provide an electrical connection/path to the die package 800 and/or the die 804 in the die package 800. In some implementations, the capacitor 818 allows some or all of the power signals to and from the die package 800 (e.g., die 804 inside the die package 800) to bypass some or all of the solder balls 816 in a power delivery network. It should be noted that in some implementations, solder may be used to couple the capacitor to the substrate (e.g., package substrate, PCB). Such solder is small relative to the solder balls (e.g., solder balls 816), and shall not be considered part of the solder balls.

FIG. 8 also illustrates that the PCB 820 includes a second set of vias 822-824. The second set of vias 822-824 are power signal/ground vias 812-814 for the PCB 820. In some implementations, the second set of vias 822-824 are part of a power delivery network for a die package (e.g., die package 800) and/or die (e.g., die 804) in a die package. As shown in FIG. 8, the decoupling capacitor 818 is between the first set of vias 812-814 and the second set of vias 822-824. In some implementations, the decoupling capacitor 818 is part of a power delivery network that provides power to/from a die package (e.g., die package 800) and/or a die (e.g., die 804) in a die package. In some implementations, the capacitor 818 is configured to provide a noise reduction in a power delivery network (PDN) for the die package 800 and/or the PCB 820. In some implementations, power from a power source (not shown) may traverse the PCB 820 through the second set of vias 822-824, the capacitor 818, and the first set of vias 812-814, and the solder balls 820 to reach the die package 800 and/or the die 804 of the die package 800. In some implementations, power may also traverse the set of solder balls 816 to reach the die package 800 and/or the die 804 of the die package 800. FIG. 8 illustrates a die 800 that is a flip chip. However, in some implementations, the die that is in the die package may be a chip that is electrically coupled to the package substrate 802 by wire bond. In such instances, power to the die/chip may traverse the second set of vias 822-824, the capacitor 818, the first set of vias 812-814 and wire bonds (not shown) to reach the die.

In some implementations, the decoupling capacitor may be located between other components. Other examples of a decoupling capacitor located between other components will now be described below.

Exemplary Decoupling Capacitor Between Die Packages

Figure 9:
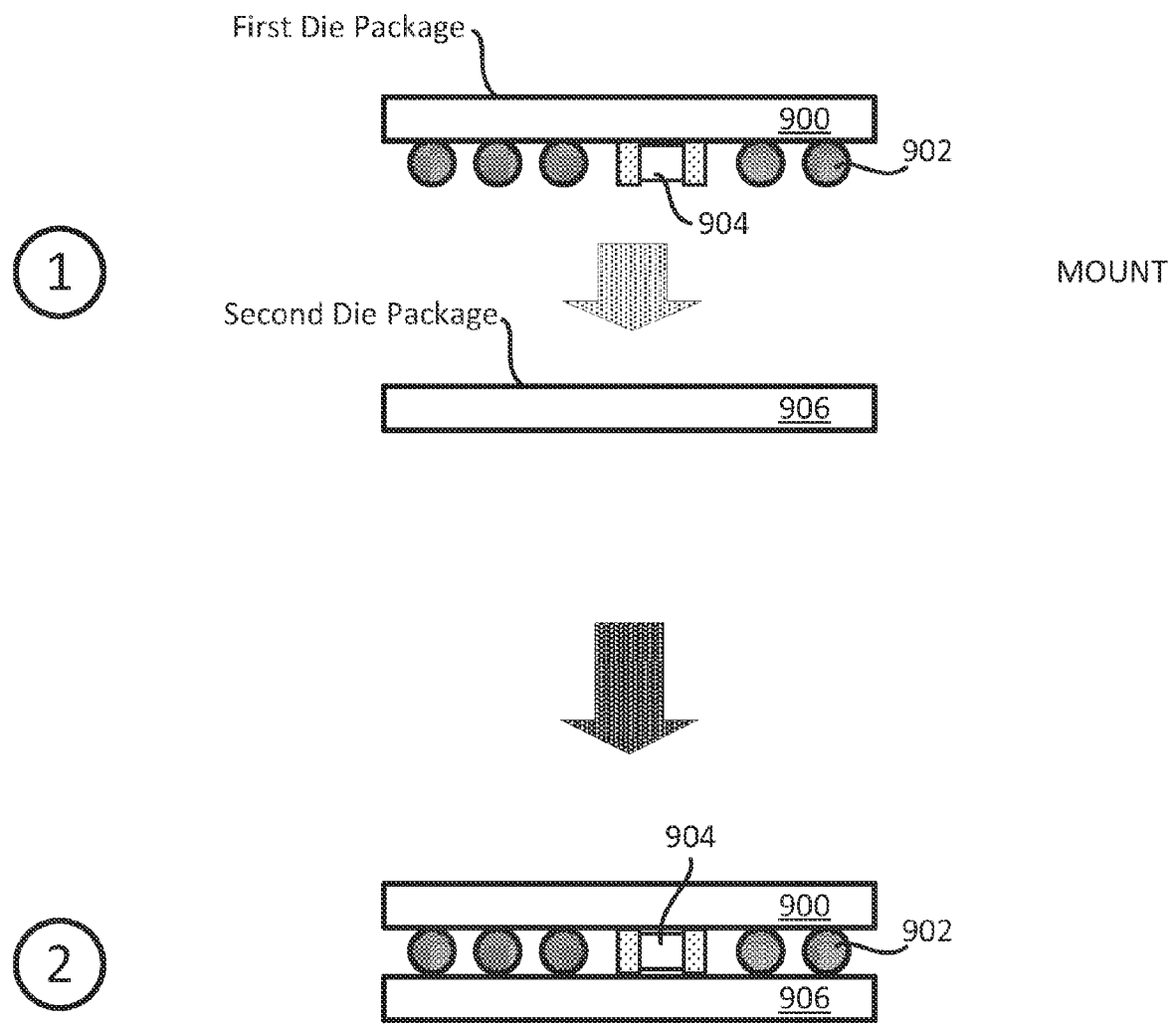
FIG. 9 illustrates a sequence of a first die package with a decoupling capacitor being couple to a second die package.

In some implementations, a decoupling capacitor may also be positioned between two die packages (e.g., package on package (POP)). FIG. 9 illustrates the coupling (e.g., mounting) of a die package having at least one capacitor to another die package. Specifically, FIG. 9 illustrates the die package 900 (which includes the set of solder balls 902 and the capacitor 904) being coupled (e.g., mounted) to a second die package 906. Once the die package 900 has been coupled (e.g., mounted) to the die package 906, the capacitor 904 is positioned between the die package 900 and the second die package 906. More specifically, the capacitor 904 is positioned underneath the first die package 900. In this position and configuration, the capacitor 904 is configured to provide an electrical connection between the die package 900 and the die package 906. In particular, in some implementations, the capacitor 904 is configured to provide an electrical connection/path between a die (not shown) in the die package 900 and the second die package 906 (e.g., die in the second die package). More specifically, in some implementations, the capacitor 904 (e.g., decoupling capacitor) is configured to provide an electrical connection/path between a die (e.g., die in the first package) and the second die package 906 when the first die package 900 is coupled (e.g., mounted) to the second die package 906. The capacitor 904 (e.g., decoupling capacitor) is coupled to the first die package 900 such that the capacitor 904 is positioned between the first die package 900 and the second die package 906 when the first die package 900 is coupled on the second die package 906. In some implementations, the capacitor 904 is configured to provide an electrical connection/path between a first die (not shown) in the first die package 900 and a second die (not shown) in the second die package 906.

Figure 10:
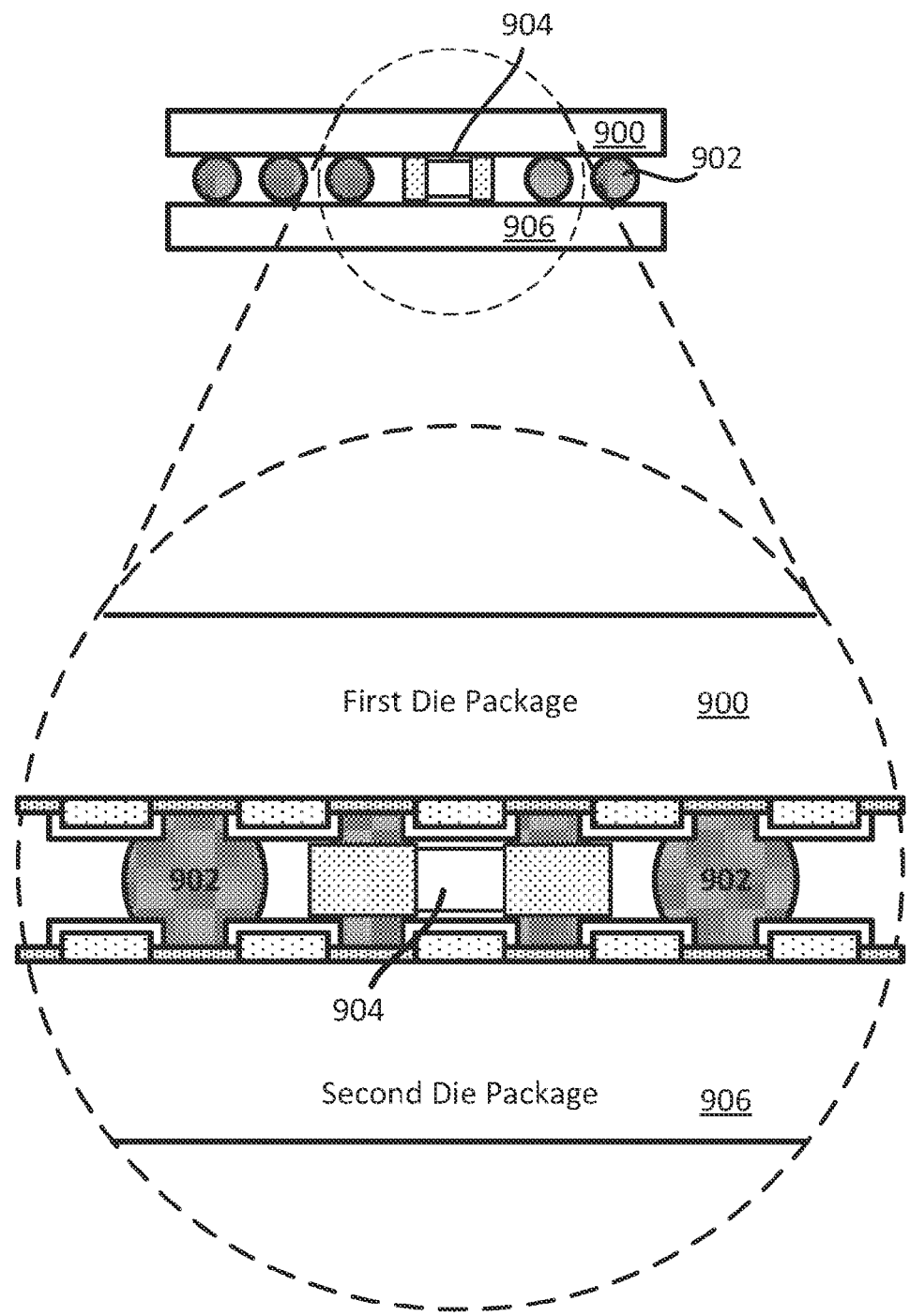
FIG. 10 illustrates a close up view of a first die package with a decoupling capacitor coupled to a second die package.

FIG. 10 illustrates a close up view of the capacitor 904 when the package 900 is coupled (e.g., mounted) to the package 906. As shown in FIG. 9, the capacitor 904 has a thickness that is less than the thickness of the solder balls 902. As mentioned above, in some implementations, the capacitor 904 provides dual purpose functionalities, namely (1) to provide an electrical connection between the die package 900 and the die package 906, and (2) to provide a noise reduction in a power delivery network (PDN) for the die package 900 and/or the die package 906. More specifically, in some implementations, the capacitor 904 (e.g., decoupling capacitor) is configured to provide an electrical connection/path between a die and the second die package 906 when the first die package 900 is coupled (e.g., mounted) to the second die package 906. The capacitor 904 (e.g., decoupling capacitor) is coupled to the first die package 900 such that the capacitor 904 is positioned between the first die package 900 and the second die package 906 when the first die package 900 is coupled on the second die package 906. In some implementations, capacitor 904 (e.g., decoupling capacitor) is configured to decouple one part of an electrical network from another. In some implementations, the capacitor 904 allows some or all of the power signals to and from the die package 900 (e.g., die inside the die package) to bypass some or all of the solder balls 902 in a power delivery network. It should be noted that in some implementations, solder may be used to couple the capacitor to the substrate (e.g., package substrate, PCB). Such solder is small relative to the solder balls (e.g., solder balls 902), and shall not be considered part of the solder balls. Although only one capacitor (e.g., capacitor 904) is shown between the first die package 900 and the second die package 906, in some implementations, multiple capacitors may be located between the first die package 900 and the second die package 906.

Figure 11:
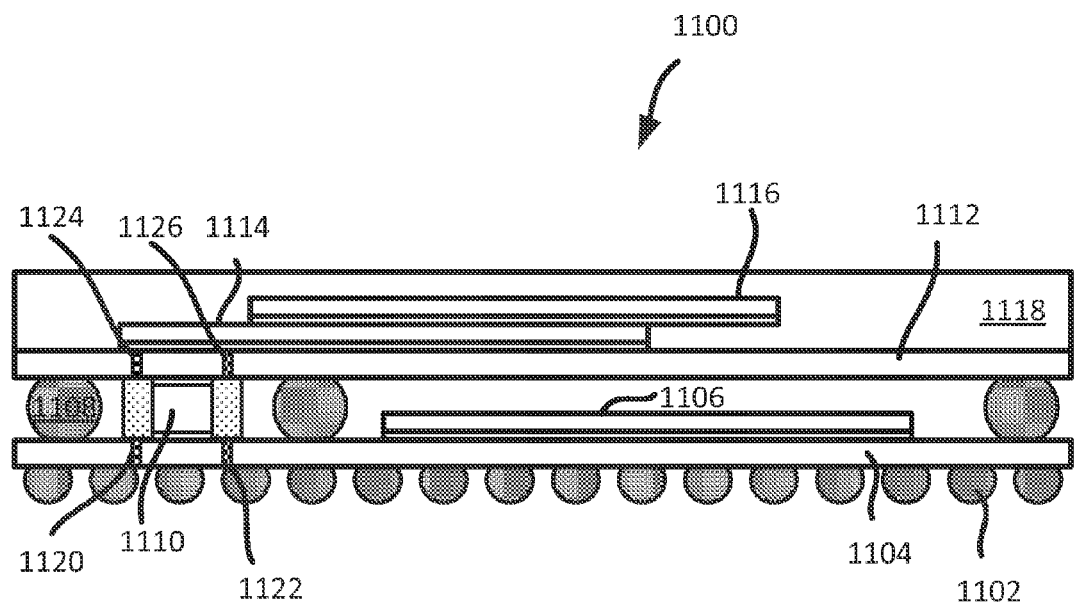
FIG. 11 illustrates a view of a package on package (PoP) configuration that includes a decoupling capacitor.

FIG. 11 illustrates a more detailed example of a package on package (PoP) configuration that includes a decoupling capacitor. Specifically, FIG. 11 illustrates package on package (PoP) configuration 1100 that includes a first set of solder 1102, a first substrate 1104, a first die 1106, a second set of solders 1108, a capacitor 1110, a second substrate 1112, a second die 1114, a third die 1116, and a molding 1118.

The first set of solder 1102 is coupled to the first substrate 1104. The first substrate 1104 may be a package substrate. The first substrate 1104 includes a first set of vias 1120-1122. The first set of vias 1120-1122 may be power signal vias that are part of a power distribution network (PDN). The first die 1106 is coupled to the first substrate 1104. The first die 1106 may include an active region and a back side region. The back side region may include metal layers and dielectric layers. The first die 1106 may be a flip chip that is electrically coupled to the first substrate 1104 through a set of solder balls (not shown). In some implementations, the first die 1106 is electrically coupled to the first substrate 1104 through a set of wire bond (not shown).

The second set of solder balls 1108 is coupled to the first substrate 1104 and the second substrate 1112. The second substrate 1112 may be a package substrate. The second set of solder balls 1108 may be configured to provide an electrical connection/path between the first substrate 1104 and the second substrate 1112. The second substrate 1112 includes a second set of vias 1124-1126. The second set of vias 1124-1126 may be power signal vias that are part of a power distribution network (PDN).

The capacitor 1110 is coupled to the second substrate 1112. More specifically, the capacitor 1110 is coupled to the second set of vias 1124-1126. The capacitor 1110 is also coupled to the first substrate 1104. More specifically, the capacitor 1110 is coupled to the first set of vias 1120-1122. The capacitor 1110 is a decoupling capacitor. In some implementations, the capacitor (e.g., capacitor 1110) is configured (1) to provide an electrical connection/path to/from the second die 1114, and (2) to provide a noise reduction in a power delivery network (PDN). In some implementations, the capacitor 1110 is configured to decouple one part of an electrical network from another. In some implementations, the capacitor 1110 allows some or all of the power signals to and from the second die 1112 to bypass some or all of the solder balls 1108 between the first and second substrates 1104-1112 (e.g., in a power delivery network). It should be noted that in some implementations, solder may be used to couple the capacitor to the substrate (e.g., package substrate, PCB). Such solder is small relative to the solder balls (e.g., solder balls 1108), and shall not be considered part of the solder balls.

The second die 1114 is coupled to the second substrate 1112. The second die 1114 may include an active region and a back side region. The back side region may include metal layers and dielectric layers. The second die 1114 may be a flip chip that is electrically coupled to the second substrate 1112 through a set of solder balls (not shown). In some implementations, the second die 1114 is electrically coupled to the second substrate 1112 through a set of wire bond (not shown). The third die 1116 may be coupled to the second die 1114. In some implementations, the third die 1116 is positioned above the second die 1114. The third die 1116 may be offset from the second die 1114, in some implementations. The third die 1116 may include an active region and a back side region. The back side region may include metal layers and dielectric layers. The third die 1116 may be a flip chip that is electrically coupled to the second die 1114 through a set of solder balls (not shown). In some implementations, the third die 1116 is electrically coupled to the second substrate 1112 through a set of wire bond (not shown). In some implementations, the second and/or third dies 1114-1116 may be coupled to the second set of vias 1124-1126 through solder balls or wire bond (both not shown).

The second and third dies 1114-1116 are surrounded by the molding 1118. In some implementations, the molding 1118 encapsulates the second and third dies 1114-1116 and provides a protective layer for the second and third dies 1114-1116.

Although only one decoupling capacitor (e.g., capacitor 1110) is shown between the first substrate 1104 and the second substrate 1112, in some implementations, multiple capacitors (e.g., decoupling capacitors) may be located between the first substrate 1104 and the second substrate 1112.

Having described various examples of a decoupling capacitor between a die package and a substrate (e.g., PCB), as well as a decoupling capacitor between two die packages, a method for providing/manufacturing a decoupling capacitor between various components will now be described below.

Figure 12:
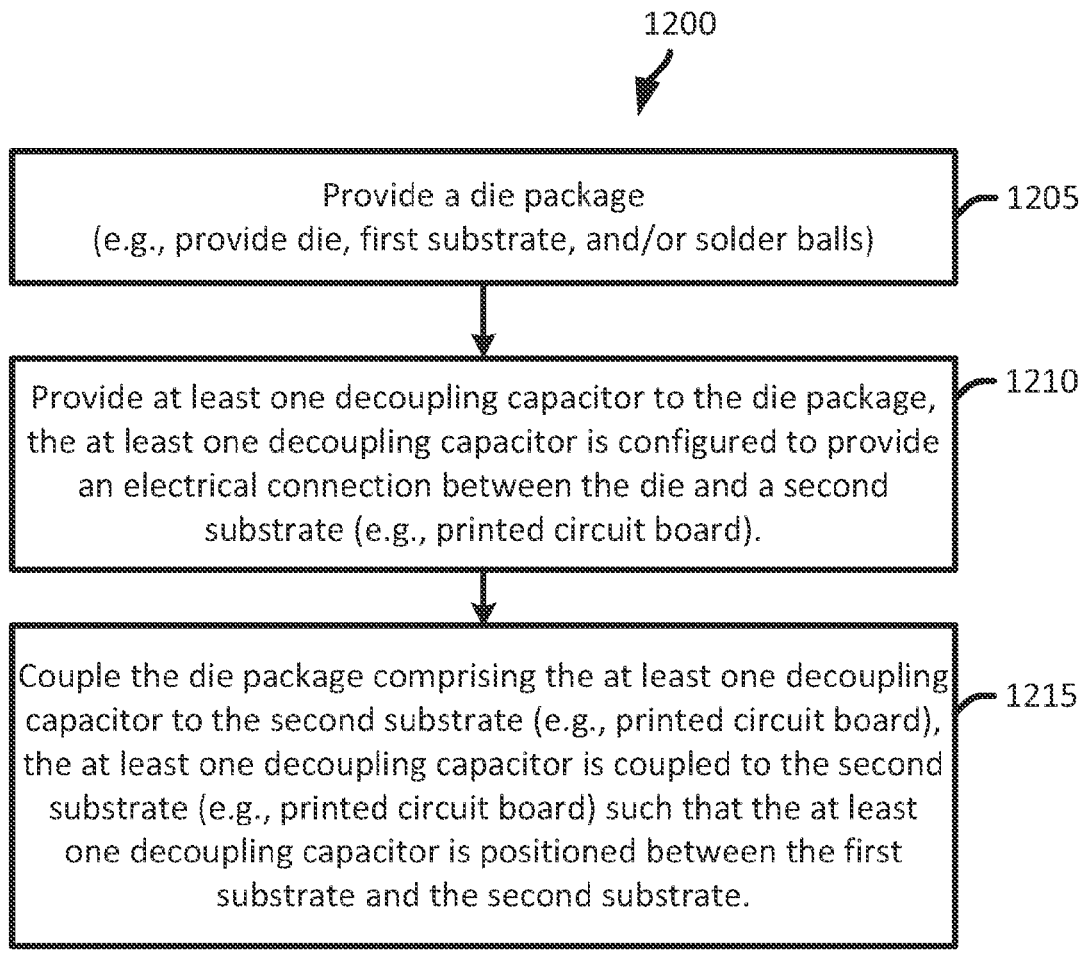
FIG. 12 illustrates a flow diagram of a method for assembling a die package with a decoupling capacitor coupled to a printed circuit board.

Exemplary Method for Providing/Assembling a Decoupling Capacitor Between Die Package and Printed Circuit Board FIG. 12 illustrates a flow diagram of a method for assembling a die package with a decoupling capacitor to a printed circuit board (PCB).

The method provides (at 1205) a die package (e.g., die package 800). The die package may include a first substrate (e.g., package substrate), a die and a molding. The die package may also include a set of solder balls, where the set of solder balls may be coupled to the package substrate. In some implementations, the set of solder balls is configured to provide an electrical connection/path between the die package and a second substrate (e.g., a printed circuit board (PCB)) when the die package is coupled (e.g., mounted) to the second substrate (e.g., PCB).

In some implementations, providing (at 1205) the die package may include manufacturing and/or assembling the die package. For example, providing the die package may include providing a die, coupling the die to a package substrate and then covering the die with a molding. In some implementations, the package substrate may include power and ground vias that are coupled to the die of the die package. In some implementations, the power and ground vias are part of a power delivery network that provides/delivers power to/from a die in the die package.

The method also provides (at 1210) at least one decoupling capacitor to the die package. Different implementations may provide different decoupling capacitors. In some implementations, providing (at 1210) the at least one decoupling capacitor may include manufacturing and/or assembling the decoupling capacitor. In some implementations, the at least one decoupling capacitor is configured to provide an electrical connection/path between the die and a second substrate (e.g., PCB) when the die package is coupled (e.g., mounted) on the second substrate (e.g., PCB). The at least one decoupling capacitor is coupled to the die package such that the at least one decoupling capacitor is positioned between the die package and the second substrate (e.g., PCB) when the die package is coupled on the substrate (e.g., PCB). For example, in some implementations, the decoupling capacitor may be positioned between a first substrate and a second substrate in a package on package (PoP) configuration. In some implementations, the decoupling capacitor is configured to provide a noise reduction in a power delivery network (PDN). In some implementations, the decoupling capacitor is configured to decouple one part of an electrical network from another.

The method further couples (at 1215) the die package that includes the at least one decoupling capacitor to a substrate (e.g., printed circuit board (PCB)). The die package is coupled to the substrate (e.g., PCB) in such a way that the decoupling capacitor is between the die package and the substrate (e.g., PCB). In some implementations, the decoupling capacitor is surrounded by a set of solder balls that couple (e.g., electrically couples) the die package to the substrate (e.g., PCB). In some implementations, the substrate (e.g., PCB) may includes a set of power and ground vias that are part of a power delivery network that provides/delivers power to/from a die/die package coupled to the substrate (e.g., PCB). In some implementations, the decoupling capacitor is configured to provide an electric path for power to/from the die and/or die package.

Figure 13:
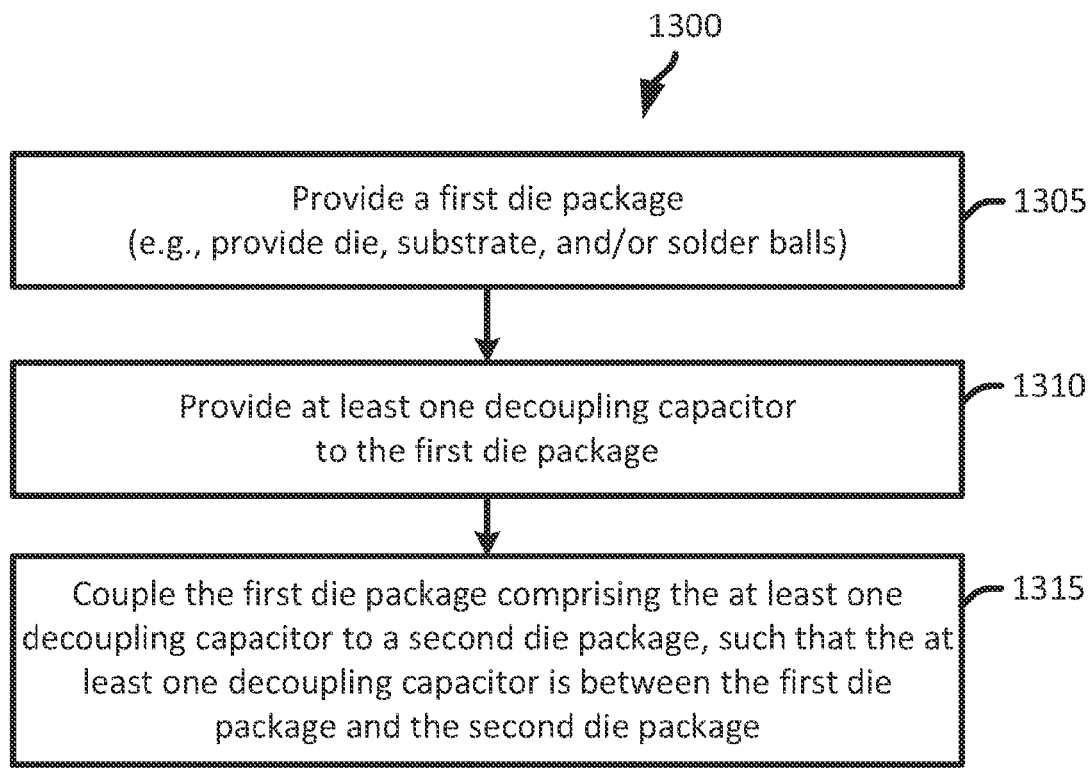
FIG. 13 illustrates a flow diagram of a method for assembling a first die package with a decoupling capacitor coupled to a second die package.

Exemplary Method for Providing/Assembling a Decoupling Capacitor Between Die Packages FIG. 13 illustrates a flow diagram of a method for assembling a first die package with a decoupling capacitor to a second die package.

The method provides (at 1305) a first die package (e.g., die package 900). The first die package may include a package substrate, a die and a molding. The first die package may also include a set of solder balls, where the set of solder balls may be coupled to the package substrate. In some implementations, the set of solder balls is configured to provide an electrical connection/path between the first die package and a second die package when the first die package is coupled to the second die package.

In some implementations, providing (at 1305) the first die package may include manufacturing and/or assembling the first die package. For example, providing the first die package may include providing a die, coupling the die to a package substrate and then covering the die with a molding. In some implementations, the package substrate may include power and ground vias that are coupled to the die of the first die package. In some implementations, the power and ground vias are part of a power delivery network that provides/delivers power to/from a die in the first die package.

The method also provides (at 1310) at least one decoupling capacitor to the first die package. Different implementations may provide different decoupling capacitors. In some implementations, providing (at 1310) the at least one decoupling capacitor may include manufacturing and/or assembling the decoupling capacitor. In some implementations, the at least one decoupling capacitor is configured to provide an electrical connection/path between the die in the first die package and a die in a second die package when the first die package is coupled to the second die package. The at least one decoupling capacitor is coupled (e.g., mounted) to the first die package such that the at least one decoupling capacitor is positioned between the first die package and the second die package when the first die package is coupled to the second die package. In some implementations, the decoupling capacitor is configured to provide a noise reduction in a power delivery network (PDN). In some implementations, the decoupling capacitor is configured to decouple one part of an electrical network from another.

The method further couples (at 1315) the first die package that includes the at least one decoupling capacitor to a second die package (e.g., die package 1120). The first die package is coupled to the second die package in such a way that the decoupling capacitor is between the first die package and the second die package. In some implementations, the decoupling capacitor is surrounded by a set of solder balls that couple (e.g., electrically couple) the first die package to the second die package.

The second die package may include a package substrate, a die and a molding. In some implementations, the package substrate may include power and ground vias that are coupled to the die of the second die package. In some implementations, the power and ground vias are part of a power delivery network that provides/delivers power to/from a die in the first and/or second die packages. In some implementations, the decoupling capacitor is configured to provide an electric path for power to/from the die and/or die package (e.g., either or both die packages).

Exemplary Electronic Devices

Figure 14:
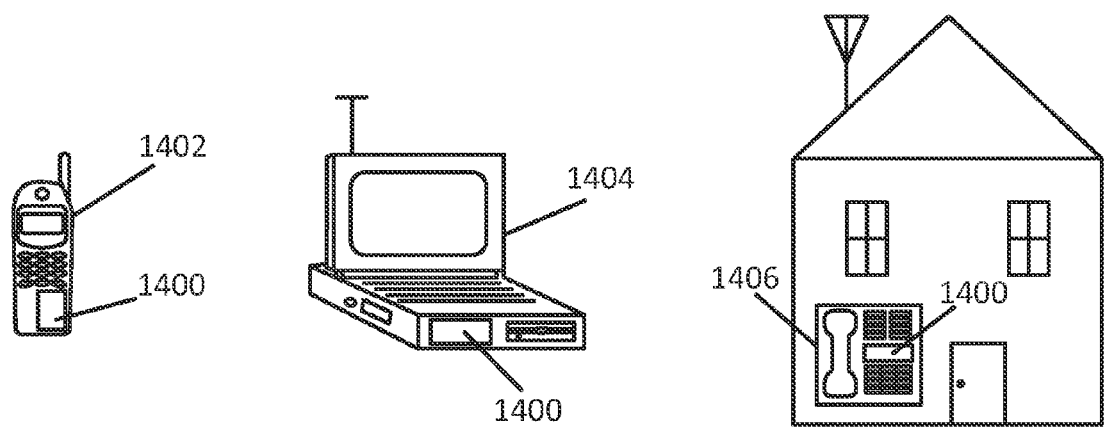
FIG. 14 illustrates various electronic devices that may be integrated with any of the aforementioned integrated circuit, die or package.

FIG. 14 illustrates various electronic devices that may be integrated with any of the aforementioned integrated circuit, die or package. For example, a mobile telephone 1402, a laptop computer 1404, and a fixed location terminal 1406 may include an integrated circuit (IC) 1400 as described herein. The IC 1400 may be, for example, any of the integrated circuits, dice or packages described herein. The devices 1402, 1404, 1406 illustrated in FIG. 14 are merely exemplary. Other electronic devices may also feature the IC 1400 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications device, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, and/or 14 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other. The term "die package" is used to refer to an integrated circuit wafer that has been encapsulated or packaged or encapsulated.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor device comprising;
a first substrate;
a die coupled to the first substrate;
a plurality of solder balls coupled to the first substrate and coupled to a second substrate, the plurality of solder balls configured to provide a first electrical connection between the die and the second substrate;
at least one decoupling capacitor coupled to the first substrate such that the at least one decoupling capacitor is positioned between the first substrate and the second substrate; and
at least one plurality of through vias in the first substrate configured to electrically couple the die to the at least one decoupling capacitor,
wherein the plurality of through vias and the at least one decoupling capacitor are configured to provide a second electrical connection, between the die and the second substrate, that bypasses the plurality of solder balls coupled to the first substrate and the second substrate.

2. The semiconductor device of claim 1, wherein the plurality of through vias and the at least one decoupling capacitor that are configured to provide the second electrical connection, are part of a power delivery network for the die.

3. The semiconductor device of claim 1, wherein the decoupling capacitor is a multi-layer ceramic capacitor (MLCC).

4. The semiconductor device of claim 1, wherein the second substrate is a printed circuit board (PCB).

5. The semiconductor device of claim 1, wherein the first substrate is a first package substrate, the second substrate is a second package substrate, and the die is a first die.

6. The semiconductor device of claim 5, wherein the semiconductor device further includes a second die positioned between the first package substrate and the second package substrate, and the semiconductor device is integrated in a package on package (PoP) configuration.

7. The semiconductor device of claim 1, wherein the at least one decoupling capacitor is configured to provide noise reduction in a power delivery network (PDN) for the die.

8. The semiconductor device of claim 1, wherein the at least one decoupling capacitor is aligned along one of a row of solder balls and/or a column of solder balls.

9. The semiconductor device of claim 1, wherein the at least one decoupling capacitor is aligned diagonally with respect to a row of solder balls and/or a column of solder balls, the row of solder balls and the column of solder balls being substantially perpendicular or substantially parallel to a side surface of the semiconductor device.

10. The semiconductor device of claim 1, wherein the semiconductor device is incorporated into at least one of a music player, a video player, an entertainment unit, a navigation device, a communications device, a mobile phone, a smartphone, a personal digital assistant, a fixed location terminal, a tablet computer, and/or a laptop computer.

11. An apparatus comprising;
a first substrate;
a die coupled to the first substrate;
a plurality of solder balls coupled to the first substrate and coupled to a second substrate, the plurality of solder balls configured to provide a first electrical connection between the die and the second substrate; and
decoupling means configured to store electrical energy, wherein the decoupling means is coupled to the first substrate such that the decoupling means is positioned between the first substrate and the second substrate; and
a plurality of through vias in the first substrate configured to couple the die to the decoupling means,
wherein the plurality of through vias and the decoupling means are configured to provide a second electrical connection, between the die and the second substrate, that bypasses the plurality of solder balls coupled to the first substrate and the second substrate.

12. The apparatus of claim 11, wherein the plurality of through vias and the decoupling means that are configured to provide the second electrical connection, are part of a power delivery network for the die.

13. The apparatus of claim 11, wherein the decoupling means is a multi-layer ceramic capacitor (MLCC).

14. The apparatus of claim 11, wherein the second substrate is a printed circuit board (PCB).

15. The apparatus of claim 11, wherein the first substrate is a first package substrate, the second substrate is a second package substrate, and the die is a first die.

16. The apparatus of claim 15, wherein the semiconductor device further includes a second die positioned between the first package substrate and the second package substrate, and the semiconductor device is integrated in a package on package (PoP) configuration.

17. The apparatus of claim 11, wherein the decoupling means is configured to provide noise reduction in a power delivery network (PDN) for the die.

18. The apparatus of claim 11, wherein the decoupling means is aligned along one of a row of solder balls and/or a column of solder balls.

19. The apparatus of claim 11, wherein the decoupling means is aligned diagonally with respect to a row of solder balls and/or a column of solder balls, the row of solder balls and the column of solder balls being substantially perpendicular or substantially parallel to a side surface of the semiconductor device.

20. The apparatus of claim 11, wherein the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

21. A method for providing a semiconductor device, comprising:
    providing a first substrate;
    providing and coupling a die to the first substrate;
    providing and coupling a plurality of solder balls to the first substrate and a second substrate, wherein providing and coupling the plurality of solder balls comprises providing a first connection that is configured to provide a first electrical connection between the die and the second substrate; and
    providing at least one decoupling capacitor, wherein providing the at least one decoupling capacitor comprises coupling the at least one decoupling capacitor to the first substrate such that the at least one decoupling capacitor is positioned between the first substrate and the second substrate; and
    providing, in the first substrate, at least one plurality of through vias configured to couple the die to the at least one decoupling capacitor,
    wherein providing the plurality of through vias and providing the at least one decoupling capacitor comprises providing a second connection that is configured to provide a second electrical connection, between the die and the second substrate, that bypasses the plurality of solder balls coupled to the first substrate and the second substrate.

22. The method of claim 21, wherein the plurality of through vias and the at least one decoupling capacitor that are configured to provide the second electrical connection, are part of a power delivery network for the die.

23. The method of claim 21, wherein the decoupling capacitor is a multi-layer ceramic capacitor (MLCC).

24. The method of claim 21, wherein the second substrate is a printed circuit board (PCB).

25. The method of claim 21, wherein the first substrate is a first package substrate, the second substrate is a second package substrate, and the die is a first die.

26. The method of claim 25, further comprising providing a second die positioned between the first package substrate and the second package substrate, and the semiconductor device is integrated in a package on package (PoP) configuration.

27. The method of claim 21, wherein the at least one decoupling capacitor is configured to provide noise reduction in a power delivery network (PDN) for the die.

28. The method of claim 21, wherein the at least one decoupling capacitor is aligned along one of a row of solder balls and/or a column of solder balls.

29. The method of claim 21, wherein the at least one decoupling capacitor is aligned diagonally with respect to a row of solder balls and/or a column of solder balls, the row of solder balls and the column of solder balls being substantially perpendicular or substantially parallel to a side surface of the semiconductor device.

30. The method of claim 21, further comprising incorporating the semiconductor device into at least one of a music player, a video player, an entertainment unit, a navigation device, a communications device, a mobile phone, a smartphone, a personal digital assistant, a fixed location terminal, a tablet computer, and/or a laptop computer.

31. A semiconductor device, prepared by a process comprising:
    providing a first substrate;
    providing and coupling a die to the first substrate;
    providing and coupling a plurality of solder balls to the first substrate and a second substrate, wherein providing and coupling the plurality of solder balls comprises providing a first connection that is configured to provide a first electrical connection between the die and the second substrate; and
    providing at least one decoupling capacitor, wherein providing the at least one decoupling capacitor comprises coupling the at least one decoupling capacitor to the first substrate such that the at least one decoupling capacitor is positioned between the first substrate and the second substrate; and
    providing, in the first substrate, at least one plurality of through vias configured to couple the die to the at least one decoupling capacitor,
    wherein providing the plurality of through vias and providing the at least one decoupling capacitor comprises providing a second connection that is configured to provide a second electrical connection, between the die and the second substrate, that bypasses the plurality of solder balls coupled to the first substrate and the second substrate.

32. The semiconductor device of claim 1, further comprises a second plurality of through vias in the second substrate, the second plurality of vias configured to couple a bottom side of the second substrate to the at least one decoupling capacitor.

33. The semiconductor device of claim 1, further comprises a power source coupled to the bottom side of the second substrate and to the second plurality of vias.

34. The semiconductor device of claim 1, wherein the plurality of solder balls between the first substrate and the second substrate, consists of solder balls comprising a thickness that is about equal or greater than a thickness of the at least one decoupling capacitor.

* * * * *